(12) United States Patent
Chiu et al.

(10) Patent No.: US 8,331,134 B2
(45) Date of Patent: Dec. 11, 2012

(54) NON-VOLATILE STATIC RANDOM ACCESS MEMORY AND OPERATION METHOD THEREOF

(75) Inventors: Pi-Feng Chiu, Taipei County (TW);
Meng-Fan Chang, Taichung (TW);
Ku-Feng Lin, Taipei County (TW);
Shyh-Shyuan Sheu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 276 days.

(21) Appl. No.: 12/853,301

(22) Filed: Aug. 10, 2010

(65) Prior Publication Data

US 2011/0280073 A1    Nov. 17, 2011

(30) Foreign Application Priority Data

May 12, 2010   (TW) ................................ 99115131 A

(51) Int. Cl.
*G11C 11/00* (2006.01)
(52) U.S. Cl. ................ 365/154; 365/189.05; 365/185.08
(58) Field of Classification Search .................. 365/154, 365/189.05, 185.08
See application file for complete search history.

(56) References Cited

U.S. PATENT DOCUMENTS

| | | | |
|---|---|---|---|
| 6,980,459 B2 | 12/2005 | Seshadri et al. | |
| 7,149,104 B1 | 12/2006 | Horiuchi | |
| 2004/0141363 A1* | 7/2004 | Ohtsuka et al. | 365/154 |
| 2004/0196689 A1* | 10/2004 | Ohtsuka et al. | 365/154 |
| 2008/0151624 A1 | 6/2008 | Still | |
| 2010/0080042 A1* | 4/2010 | Lamorey | 365/148 |

OTHER PUBLICATIONS

Chang et al., "A Low Store Energy, Low VDDmin, Nonvolatile 8T2R SRAM with 3D Stacked RRAM Devices for Low Power Mobile Applications", , with Symposium schedule thereof, Symposium on VLSI Circuits/Technical Digest of Technical Powers, Jun. 18, 2010, pp. 229-230.
Shuu'Ichirou Yamamoto, "Nonvolatile SRAM (NV-SRAM) Using Functional MOSFET Merged with Resistive Switching Devices", IEEE Custom Integrated Circuits Conference (CICC), 2009, pp. 531-534.
Michael Fliesler et al., "A 15ns 4Mb NVSRAM in 0.13u SONOS Technology", Proc. IEEE NVSM Workshop, 2008, pp. 83-86.
Wei Wang et al., "Nonvolatile SRAM Cell", International Electron Devices Meeting (IEDM), 2006, pp. 1-4.

* cited by examiner

*Primary Examiner* — Pho M Luu
*Assistant Examiner* — Thao Bui
(74) *Attorney, Agent, or Firm* — Jianq Chyun IP Office

(57) ABSTRACT

A non-volatile static random access memory (NV-SRAM) including a latch unit, a first switch, a second switch, a first non-volatile memory (NVM), and a second NVM and an operation method thereof are provided. First terminals of the first and the second switch are respectively connected to a first and a second terminal of the latch unit. Second terminals of the first and the second switch are respectively connected to a first and a second bit line. Control terminals of the first and the second switch are connected to a word line. First terminals of the first and the second NVM are respectively connected to the first and the second terminal of the latch unit. Second terminals of the first and the second NVM are respectively connected to the first and the second bit line. Enable terminals of the first and the second NVM are connected to an enable line.

23 Claims, 13 Drawing Sheets

NON-VOLATILE STATIC RANDOM ACCESS MEMORY AND OPERATION METHOD THEREOF

CROSS-REFERENCE TO RELATED APPLICATION

This application claims the priority benefit of Taiwan application serial no. 99115131, filed on May 12, 2010. The entirety of the above-mentioned patent application is hereby incorporated by reference herein and made a part of this specification.

TECHNICAL FIELD

The disclosure relates to a memory, and more particularly, to a non-volatile static random access memory (NV-SRAM) and an operation method thereof.

BACKGROUND

Along with the advancement in the fabrication process of integrated circuit (IC), the surface areas of ICs have been greatly reduced. Accordingly, the fabricating costs of ICs are reduced and the performances thereof are improved. However, the power consumption per unit area of a system on chip (SoC) may be greatly increased due to the increase in leakage current and operating frequency. The increase in the power consumption will affect the stability and lifespan of the device. Thus, power consumption has become one of the key factors for determining the quality of a battery-powered portable product.

In a SoC, a static random access memory (SRAM) takes up a great portion of the circuit area and is a volatile memory with high access speed. When the SoC enters a sleep mode, in order to keep the data in the SRAM, the power supplied to the SRAM cannot be cut off. Herein considerable power is unnecessarily consumed due to leakage current, and this situation deteriorates along with the increase in the capacity of the SRAM and the process shrink. Contrarily, if a non-volatile memory (NVM) is adopted, the power supplied to the NVM can be cut off in the sleep mode so that no power will be consumed. However, none of existing NVMs in mass production or development can achieve the operation speed of a SRAM.

Thereby, if a SRAM and a NVM can be combined, the original characteristic of the SRAM can be kept and the power consumed due to leakage current in the sleep mode can be avoided by cutting off the power supply.

SUMMARY

A non-volatile static random access memory (NV-SRAM) and an operation method thereof are introduced herein.

The present disclosure provides a NV-SRAM and an operation method thereof, wherein a static random access memory (SRAM) and a non-volatile memory (NVM) are integrated.

According to an embodiment of the present disclosure, a NV-SRAM including a latch unit, a first switch, a second switch, a first NVM, and a second NVM is provided. The latch unit has a first terminal and a second terminal. A first terminal of the first switch is connected to the first terminal of the latch unit, a second terminal of the first switch is connected to a first bit line, and a control terminal of the first switch is connected to a word line. A first terminal of the second switch is connected to the second terminal of the latch unit, a second terminal of the second switch is connected to a second bit line, and a control terminal of the second switch is connected to the word line. A first terminal of the first NVM is connected to the first terminal of the latch unit, a second terminal of the first NVM is connected to the first bit line, and an enable terminal of the first NVM is connected to an enable line. A first terminal of the second NVM is connected to the second terminal of the latch unit, a second terminal of the second NVM is connected to the second bit line, and an enable terminal of the second NVM is connected to the enable line.

According to an embodiment of the present disclosure, an operation method of foregoing NV-SRAM is provided. The operation method includes following steps. A programming procedure is performed when a sleep mode is entered, and a recall procedure is performed when the sleep mode is ended. In the programming procedure, the first NVM and the second NVM are enabled through the enable line, and the first switch and the second switch are turned off through the word line. During a first period of the programming procedure, a logic high voltage is supplied to the first NVM and the second NVM through the first bit line and the second bit line. During a second period of the programming procedure, a logic low voltage is supplied to the first NVM and the second NVM through the first bit line and the second bit line. In the recall procedure, the first NVM and the second NVM are enabled through the enable line, a logic low voltage is supplied to the first NVM and the second NVM through the first bit line and the second bit line, and the first switch and the second switch are turned off through the word line.

According to an embodiment of the present disclosure, an operation method of foregoing NV-SRAM is provided. The operation method includes following steps. A programming procedure is performed when a sleep mode is entered, and a recall procedure and an initiate procedure are performed when the sleep mode is ended. In the programming procedure, the first NVM and the second NVM are enabled through the enable line, the first switch and the second switch are turned off through the word line, and the resistance state of the first NVM or the second NVM is changed by modulating a supply voltage of the latch unit and/or voltages on the first bit line and the second bit line. In the recall procedure, the first NVM and the second NVM are enabled through the enable line, the first switch and the second switch are turned off through the word line, and a logic low voltage is supplied to the first NVM and the second NVM through the first bit line and the second bit line. In the initiate procedure, the first NVM and the second NVM are enabled through the enable line, the first switch and the second switch are turned off through the word line, and the resistance states of the first NVM and the second NVM are initialized by modulating a supply voltage of the latch unit and/or voltages on the first bit line and the second bit line.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

An embodiment provides a non-volatile static random access memory (NV-SRAM).

Figure 1:
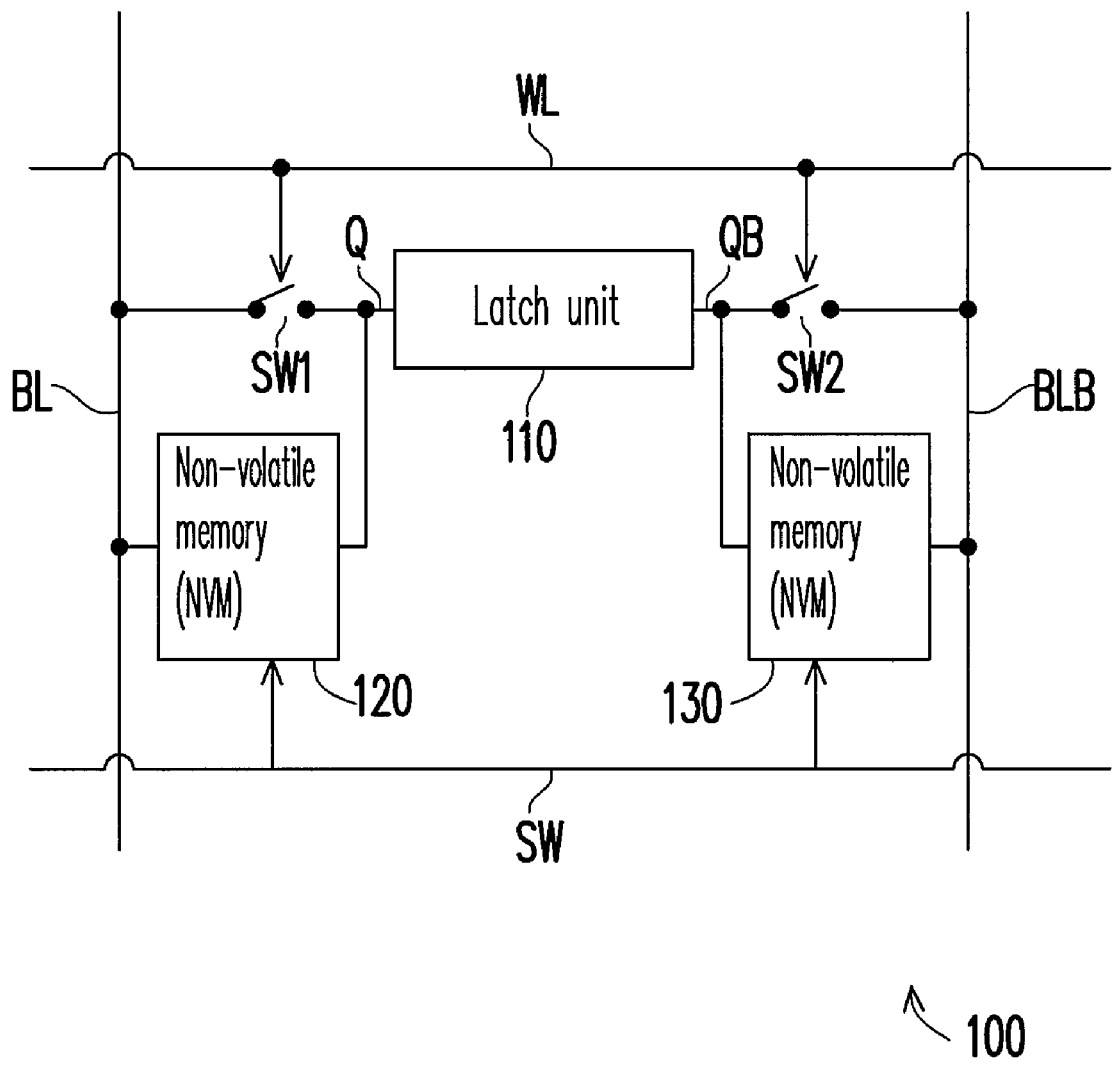
FIG. 1 is a schematic diagram illustrating the functional modules of a non-volatile static random access memory (NV-SRAM) according to an embodiment of the present disclosure.

FIG. 1 is a schematic diagram illustrating the functional modules of a NV-SRAM 100 according to an embodiment of the present disclosure. The NV-SRAM 100 includes a latch unit 110, a first NVM 120, a second NVM 130, a first switch SW1, and a second switch SW2. The latch unit 110 has a first terminal Q and a second terminal QB. A first terminal of the first switch SW1 is connected to the first terminal Q of the latch unit 110. A second terminal of the first switch SW1 is connected to a first bit line BL. A control terminal of the first switch SW1 is connected to a word line WL. A first terminal of the second switch SW2 is connected to the second terminal QB of the latch unit 110. A second terminal of the second switch SW2 is connected to a second bit line BLB. A control terminal of the second switch SW2 is connected to the word line WL. The first switch SW1 and the second switch SW2 may be implemented as metal oxide semiconductor (MOS) transistors, bipolar junction transistors (BJTs), or diodes, etc.

The first NVM 120 and the second NVM 130 may be resistive memories, phase change memories (PCMB), or other NVMs. A first terminal of the first NVM 120 is connected to the first terminal Q of the latch unit 110. A second terminal of the first NVM 120 is connected to the first bit line BL. An enable terminal of the first NVM 120 is connected to an enable line SW. A first terminal of the second NVM 130 is connected to the second terminal QB of the latch unit 110. A second terminal of the second NVM 130 is connected to the second bit line BLB. An enable terminal of the second NVM 130 is connected to the enable line SW. The first NVM 120 and the second NVM 130 can be enabled or disabled through the enable line SW.

In a regular read operation, the first NVM 120 and the second NVM 130 are disabled through the enable line SW, and the latch unit 110 is enabled through the word line WL. After that, the information recorded by the latch unit 110 is read through the first bit line BL and/or the second bit line BLB. Thus, the NV-SRAM 100 has the high-speed access characteristic of a static random access memory (SRAM) in a regular operation mode.

When a sleep mode is entered, the NV-SRAM 100 performs a programming procedure to record information of the latch unit 110 into the NVMs 120 and 130. In the programming procedure, the NVMs 120 and 130 are enabled through the enable line SW, and the first switch SW1 and the second switch SW2 are turned off through the word line WL. During a first period of the programming procedure, a logic high voltage is supplied to the first NVM 120 and the second NVM 130 through the first bit line BL and the second bit line BLB, and during a second period of the programming procedure, a logic low voltage is supplied to the first NVM 120 and the second NVM 130 through the first bit line BL and the second bit line BLB. The first period of the programming procedure is prior to the second period thereof. In another embodiment, the first period of the programming procedure may also be after the second period thereof. After the programming procedure is completed, the logic values at the first terminal Q and the second terminal QB of the latch unit 110 are respectively recorded in the NVMs 120 and 130. After the programming procedure is completed, no electricity is supplied to the latch unit 110 in the sleep mode to reduce the power consumption.

When the sleep mode is ended, the NV-SRAM 100 performs a recall procedure to write the logic values recorded in the NVMs 120 and 130 respectively back to the first terminal Q and the second terminal QB of the latch unit 110. In the recall procedure, the enable terminals of the first NVM 120 and the second NVM 130 are enabled through the enable line SW, a logic low voltage is supplied to the second terminals of the first NVM 120 and the second NVM 130 through the first bit line BL and the second bit line BLB, and the first switch SW1 and the second switch SW2 are turned off through the word line WL. After the recall procedure is completed, the NVMs 120 and 130 respectively write the logic values back to the first terminal Q and the second terminal QB of the latch unit 110 so that the NV-SRAM 100 returns to the regular operation mode. Thereby, the NV-SRAM disclosed in the present embodiment has the original high-speed access advantage of a SRAM in the regular operation mode and the advantage of reduced power consumption of a NVM in the sleep mode.

Figure 2:
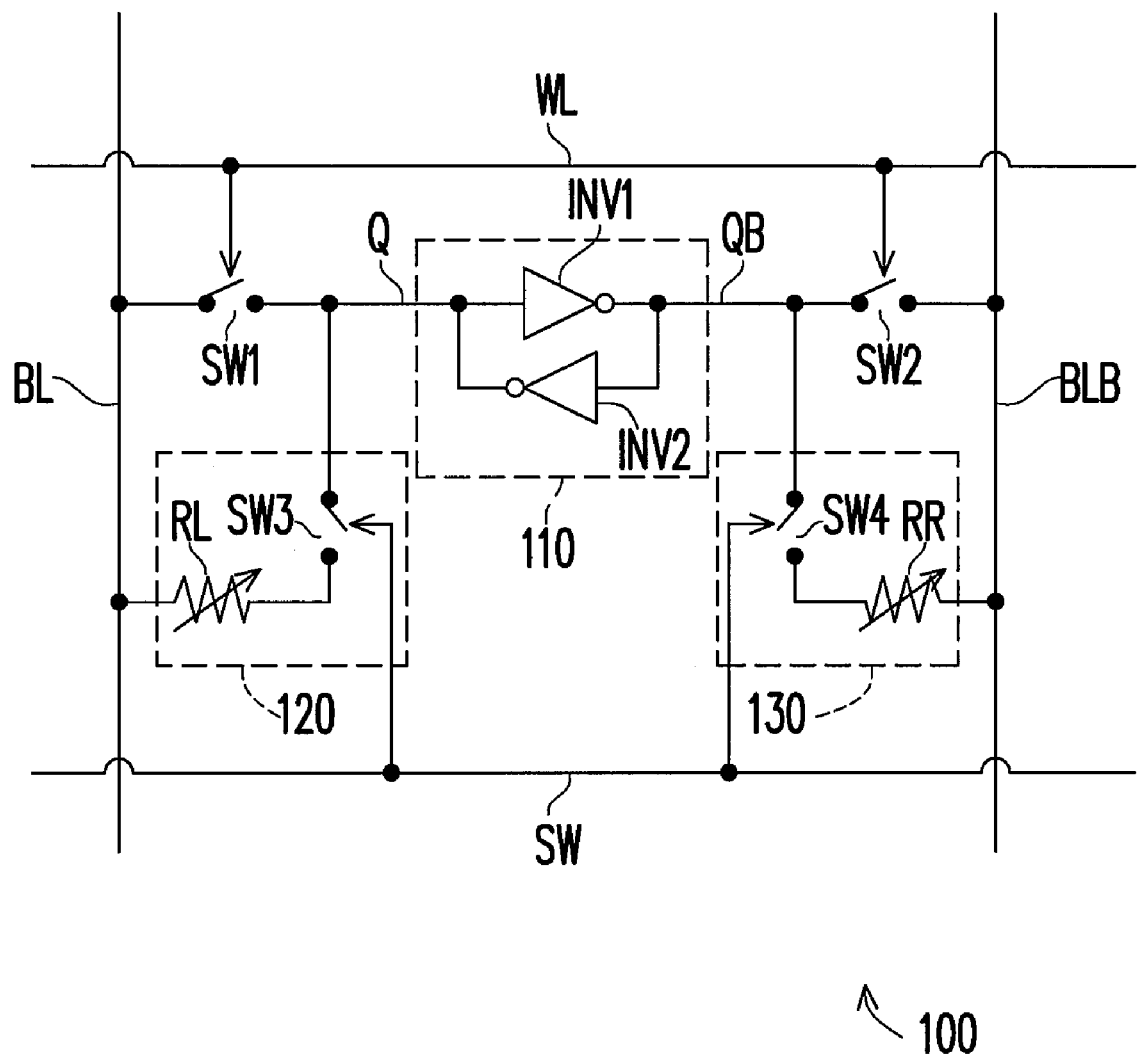
FIG. 2 is a schematic diagram illustrating an example of the NV-SRAM in FIG. 1.

The NV-SRAM 100 can be implemented according to the actual design requirement according to the present embodiment. FIG. 2 is a schematic diagram illustrating an example of the NV-SRAM 100 in FIG. 1. Referring to FIG. 2, the latch unit 110 includes a first NOT gate INV1 and a second NOT gate INV2. An input terminal of the first NOT gate INV1 is served as the first terminal Q of the latch unit 110, and an output terminal of the first NOT gate INV1 is served as the second terminal QB of the latch unit 110. An input terminal of the second NOT gate INV2 is connected to the output terminal of the first NOT gate INV1, and an output terminal of the second NOT gate INV2 is connected to the input terminal of the first NOT gate INV1.

The first NVM 120 includes a third switch SW3 and a first variable resistor RL. The third switch SW3 and the first variable resistor RL are connected between the first terminal Q of the latch unit 110 and the first bit line BL in series, and a control terminal of the third switch SW3 is connected to the enable line SW. For example, a first terminal of the third switch SW3 is connected to the first terminal Q of the latch unit 110, a second terminal of the third switch SW3 is connected to the first terminal of the first variable resistor RL, and a second terminal of the first variable resistor RL is connected to the first bit line BL.

The second NVM 130 includes a fourth switch SW4 and a second variable resistor RR. The fourth switch SW4 and the second variable resistor RR are connected between the second terminal QB of the latch unit 110 and the second bit line BLB in series, and a control terminal of the fourth switch SW4 is connected to the enable line SW. For example, a first terminal of the fourth switch SW4 is connected to the second terminal QB of the latch unit 110, a second terminal of the fourth switch SW4 is connected to the first terminal of the second variable resistor RR, and a second terminal of the second variable resistor RR is connected to the second bit line BLB. The third switch SW3 and the fourth switch SW4 may be implemented as MOS transistors, BJTs, or diodes, etc.

The variable resistors RR and RL can be implemented according to the actual design requirement according to the present embodiment. For example, the variable resistors RR and RL may be formed by sequentially and vertically stacking a bottom electrode, a variable resistor, and a top electrode on a substrate. For example, the bottom electrode material deposited on a $LaAlO_3$ (LAO) single crystal substrate may be a $YBa_2Cu_3O_7$ (YBCO) membrane, the variable resistor material may be a $Pr_{1-x}Ca_xMnO_3$ (PCMO) membrane, and the top electrode material may be a Ag membrane deposited through sputtering deposition. Additionally, besides using aforementioned perovskite material, the ZnSe—Ge heterostructure or metal oxide related to Ti, Nb, Hf, Zr, Ta, Ni, V, Zn, Sn, In, Th, or Al also offers resistance change when the pulse voltages supplied to top electrode and the bottom electrode change therefore can also be used for implementing the variable resistor. The resistance of the variable resistor is reversibly changed by supplying a voltage in different direction between the top electrode and the bottom electrode. The function of a resistive memory can be accomplished by reading the resistance of the variable resistor material.

It should be noted that the stacked structure of the variable resistors RR and RL may be disposed above the substrate of the integrated circuit (IC) (i.e., stacked above the latch unit 110, the first switch SW1, the second switch SW2, the third switch SW3, and/or the fourth switch SW4. Thus, the variable resistors RR and RL do not cause any increase in the surface area of the chip.

In the regular read operation, the third switch SW3 and the fourth switch SW4 are turned off through the enable line SW, and the first switch SW1 and the second switch SW2 are turned on through the word line WL. After that, the information recorded by the latch unit 110 is read through the first bit line BL and the second bit line BLB. Thus, in the regular read operation, the operation speed is not affected by the resistive memories (i.e., the variable resistors RR and RL). In a regular write operation, the third switch SW3 and the fourth switch SW4 are turned on through the enable line SW, and the first switch SW1 and the second switch SW2 are turned on through the word line WL. After that, the logic value is written into the latch unit 110 through the first bit line BL and the second bit line BLB. Thus, in the regular write operation, an additional current path between the first bit line BL and the first terminal Q of the latch unit 110 is formed by using the variable resistor RR and the third switch SW3, and an additional current path between the second bit line BLB and the second terminal QB of the latch unit 110 is formed by the variable resistor RL and the fourth switch SW4, such that the write operation can be sped up and carried out with a low voltage level. Accordingly, a write assistance effect is achieved without disposing any additional transistor or circuit. Thus, in the regular operation mode, compared to a SRAM, the NV-SRAM 100 offers a more stably and faster performance and can work with a lower voltage level and therefore consume less power.

When the sleep mode is entered and the programming procedure is performed, the first switch SW1 and the second switch SW2 are turned off, and the third switch SW3 and the fourth switch SW4 are turned on. Herein it is assumed that the first terminal Q of the latch unit 110 is at a logic high voltage level (logic 1), and the second terminal QB is at a logic low voltage level (logic 0). During the first period of the programming procedure, a logic high voltage is supplied to the variable resistors RR and RL through the first bit line BL and the second bit line BLB. Because the voltages on the two terminals of the first variable resistor RL are both at a logic high level, the supply voltage on the first variable resistor RL is zero therefore is not enough for changing the logic resistance state of the first variable resistor RL. Because the voltages on the two terminals of the second variable resistor RR are respectively at a logic high level and a logic low level, the voltage level of the top electrode is higher than that of the bottom electrode in the second variable resistor RR so that a forward bias over the second variable resistor RR is produced. Accordingly, the second variable resistor RR is set to a logic low resistance state.

During the second period of the programming procedure, a logic low voltage is supplied to the variable resistors RR and RL through the first bit line BL and the second bit line BLB. Regarding the first variable resistor RL, the bottom electrode and the top electrode thereof are respectively at a logic high level and a logic low level so that a reverse bias over the first variable resistor RL is produced. Accordingly, the first variable resistor RL is reset to a logic high resistance state. As to the second variable resistor RR, because the voltages on the two terminals of the second variable resistor RR are both a logic low voltage, the supply voltage on the second variable resistor RR is zero and thereof is not enough for changing the logic resistance state of the second variable resistor RR. Thus, after the programming procedure is completed, the first variable resistor RL and the second variable resistor RR respectively record the logic states at the first terminal Q and the second terminal QB of the latch unit 110 with a logic high resistance state and a logic low resistance state. The resistance of the logic high resistance state and the resistance of the logic low resistance state are not limited in the present embodiment. In some embodiments, the resistance of the logic high resistance state may be 3 times of that of the logic low resistance state. After the programming procedure is completed, no electricity is supplied to the latch unit 110 in the sleep mode, so as to reduce the power consumption.

When the sleep mode is ended, the NV-SRAM 100 performs the recall procedure to turn off the first switch SW1 and the second switch SW2 and turn on the third switch SW3 and the fourth switch SW4. In addition, in the recall procedure, a logic low voltage is supplied to the variable resistors RR and RL through the first bit line BL and the second bit line BLB.

With electricity being supplied to the latch unit 110 again in the recall procedure, the second NOT gate INV2 and the first NOT gate INV1 of the latch unit 110 respectively supply a charging current to boost up the voltages on the first terminal Q and the second terminal QB, and meanwhile, the discharging currents output from the first terminal Q and the second terminal QB respectively run through the variable resistors RR and RL. Based on foregoing assumptions, the variable resistors RR and RL respectively record the logic states of the first terminal Q and the second terminal QB of the latch unit 110 with logic high resistance state and logic low resistance state. Because the resistance of the second variable resistor RR is greater than that of the first variable resistor RL, the voltage on the first terminal Q of the latch unit 110 is greater than the voltage on the second terminal QB of the latch unit 110. Thus, after the recall procedure is completed, the variable resistors RR and RL respectively writes the logic values 1 and 0 back to the first terminal Q and the second terminal QB of the latch unit 110, so that the NV-SRAM 100 returns back to the regular operation mode.

Figure 3:
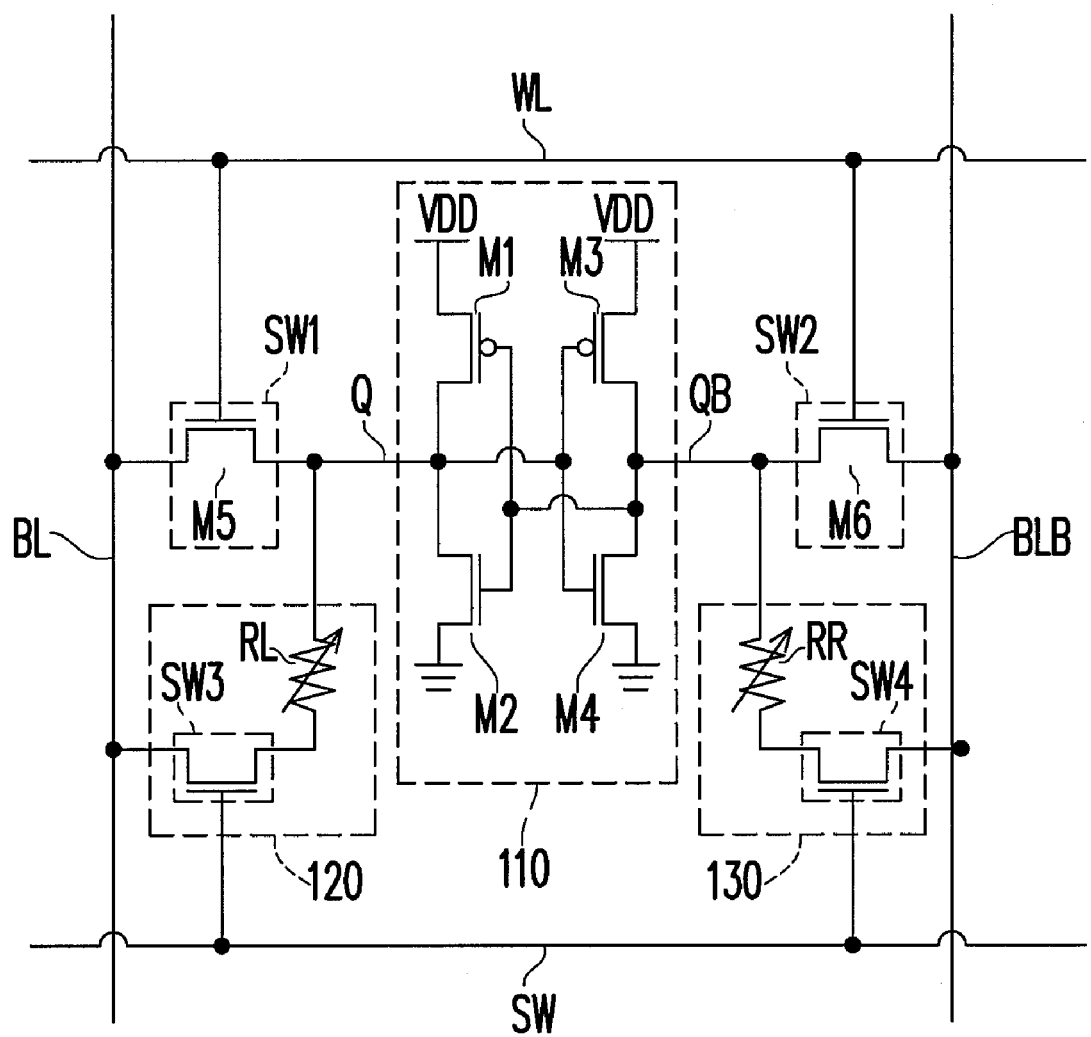
FIG. 3 is a schematic diagram illustrating another example of the NV-SRAM in FIG. 1.

FIG. 3 is a schematic diagram illustrating another example of the NV-SRAM 100 in FIG. 1. Those parts of the present embodiment that are not described herein can be referred to the description related to FIG. 1 and FIG. 2. Referring to FIG. 3, the latch unit 110 includes a first transistor M1, a second transistor M2, a third transistor M3, and a fourth transistor M4. A first terminal (for example, the source) of the first transistor M1 is connected to a first voltage (for example, a supply voltage VDD). A second terminal (for example, the drain) of the first transistor M1 is connected to the first terminal Q of the latch unit 110. A control terminal (for example, the gate) of the first transistor M1 is connected to the second terminal QB of the latch unit 110. A first terminal (for example, the source) of the second transistor M2 is connected to a second voltage (for example, a ground voltage). A second terminal (for example, the drain) of the second transistor M2 is connected to the drain of the first transistor M1. A control terminal (for example, the gate) of the second transistor M2 is connected to the gate of the first transistor M1. A first terminal (for example, the source) of the third transistor M3 is connected to the supply voltage VDD. A second terminal (for example, the drain) of the third transistor M3 is connected to the second terminal QB of the latch unit 110. A control terminal (for example, the gate) of the third transistor M3 is connected to the first terminal Q of the latch unit 110. A first terminal (for example, the source) of the fourth transistor M4 is connected to the ground voltage. A second terminal (for example, the drain) of the fourth transistor M4 is connected to the drain of the third transistor M3. A control terminal (for example, the gate) of the fourth transistor M4 is connected to the gate of the third transistor M3.

The first switch SW1 in FIG. 3 includes a fifth transistor M5. A first terminal of the fifth transistor M5 is connected to the first terminal Q of the latch unit 110. A second terminal of the fifth transistor M5 is connected to the first bit line BL. A control terminal of the fifth transistor M5 is connected to the word line WL. The second switch SW2 in FIG. 3 includes a sixth transistor M6. A first terminal of the sixth transistor M6 is connected to the second terminal QB of the latch unit 110. A second terminal of the sixth transistor M6 is connected to the second bit line BLB. A control terminal of the sixth transistor M6 is connected to the word line WL. In the present embodiment, both the fifth transistor M5 and the sixth transistor M6 are N-channel metal oxide semiconductor (NMOS) transistors.

Figure 4A:
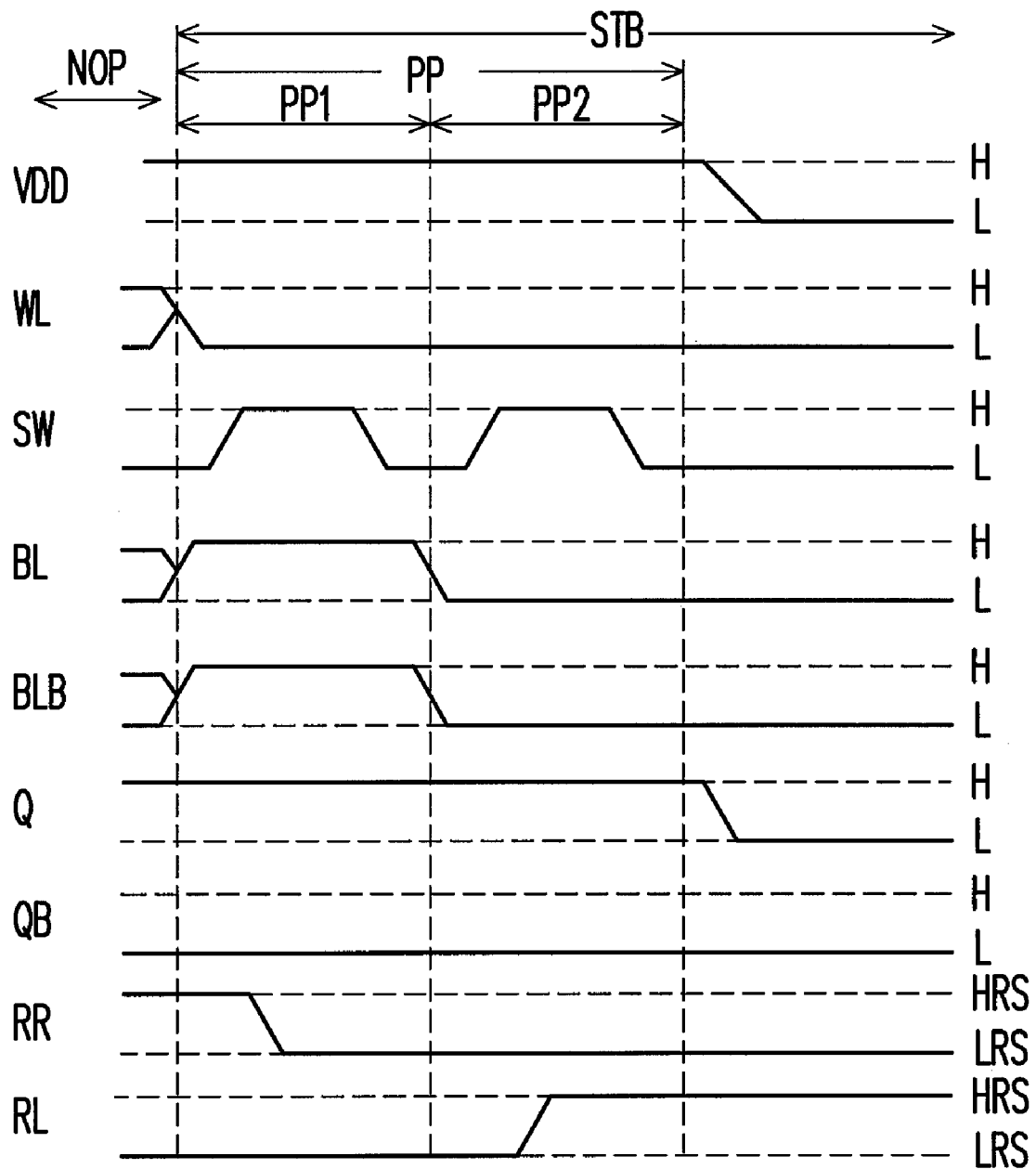
FIG. 4A is a diagram illustrating the signal timing when the NV-SRAM in FIG. 3 performs a programming procedure according to an embodiment of the present disclosure.
Figure 4B:
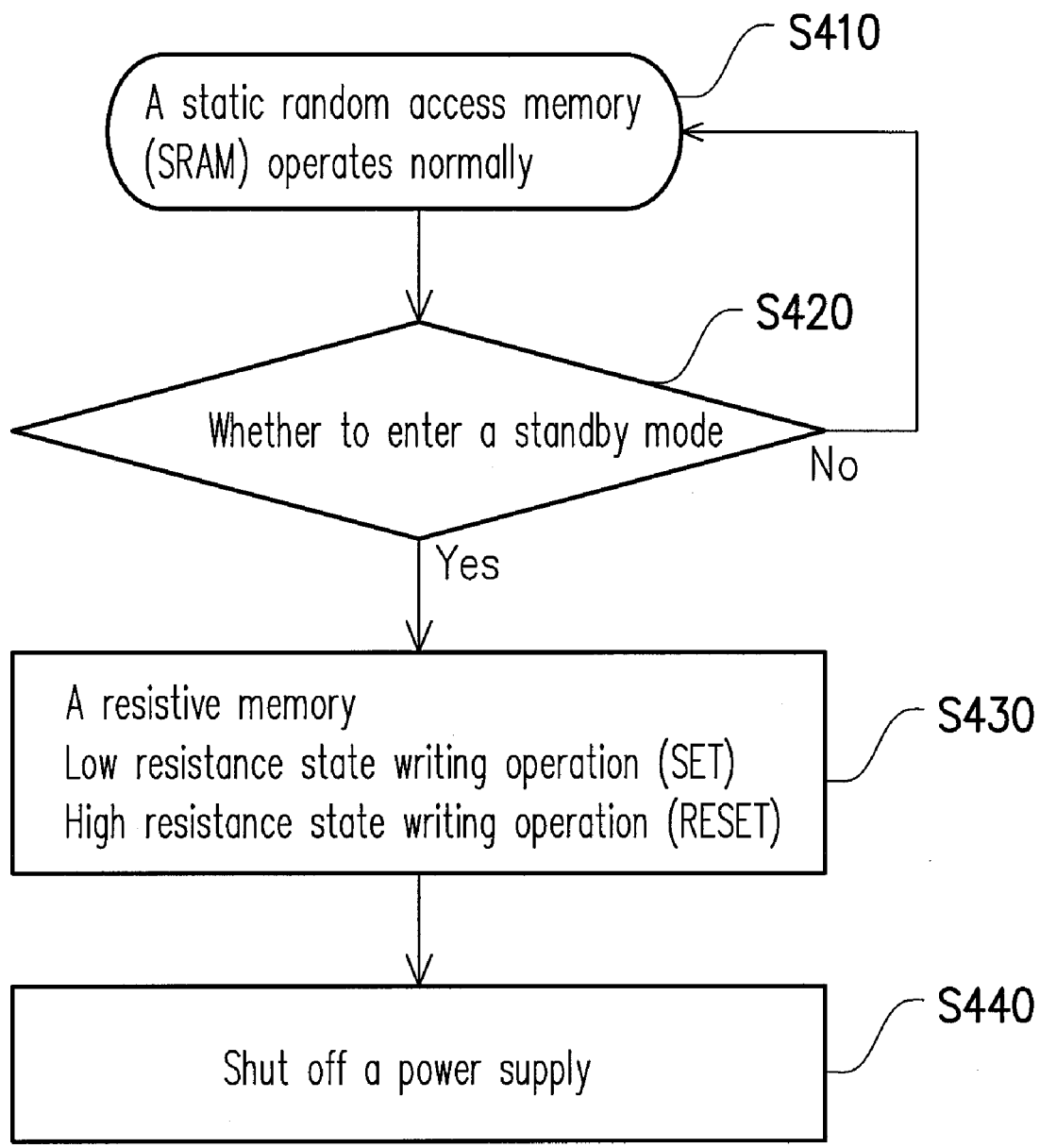
FIG. 4B is a flowchart illustrating how the NV-SRAM in FIG. 3 enters a sleep mode according to an embodiment of the present disclosure.

Herein the variable resistors RR and RL are assumed to be bipolar resistive memories. FIG. 4A is a diagram illustrating the signal timing when the NV-SRAM 100 in FIG. 3 performs a programming procedure PP according to an embodiment of the present disclosure. FIG. 4B is a flowchart illustrating how the NV-SRAM 100 in FIG. 3 performs the programming procedure PP according to an embodiment of the present disclosure. Referring to FIG. 3, FIG. 4A, and FIG. 4B, in a regular operation mode NOP (i.e., S410), the NV-SRAM 100 is addressed through the word line WL and accesses the information recorded by the latch unit 110 through the first bit line BL and/or the second bit line BLB. In the regular operation mode NOP, whether the system should enter a sleep mode STB is determined in step S420. If it is determined in step S420 that the system should enter the sleep mode STB, the programming procedure PP is performed (i.e., S430). In the programming procedure PP, the word line WL is at a logic low level L such that the first switch SW1 and the second switch SW2 are turned off. Herein it is assumed that the voltages on the first terminal Q and the second terminal QB of the latch unit 110 are respectively at a logic high level H and the logic low level L.

During a first period PP1 of the programming procedure PP, the enable line SW is at the logic high level H such that the third switch SW3 and the fourth switch SW4 are turned on. During the first period PP1, the logic high level H is supplied to the variable resistors (or referred to as resistive memories) RR and RL through the first bit line BL and the second bit line BLB. Because the voltages on the two terminals of the first variable resistor RL are both at the logic high level H, the logic resistance state of the first variable resistor RL is not changed. The voltage on the top electrode of the second variable resistor RR is at the logic high level H, and the voltage on the bottom electrode of the second variable resistor RR is at the logic low level L. Thus, the second variable resistor RR is set to a logic low resistance state LRS. Namely, the second variable resistor RR performs a low resistance state writing operation (SET).

During a second period PP2 of the programming procedure PP, the enable line SW is at the logic high level H such that the third switch SW3 and the fourth switch SW4 are turned on. During the second period PP2, the logic low level L is supplied to the variable resistors RR and RL through the first bit line BL and the second bit line BLB. The voltage on the top electrode of the first variable resistor RL is at the logic low level L, and the voltage on the bottom electrode of the first variable resistor RL is at the logic high level H. Thus, the first variable resistor RL is reset to a logic high resistance state HRS. Namely, the first variable resistor RL performs a high resistance state writing operation (RESET). Because the voltages on the two terminals of the second variable resistor RR are both at the logic low level L, the logic resistance state of the second variable resistor RR is not changed. Thus, after the sleep mode STB is entered, each NV-SRAM 100 stores data in the latch unit 110 into the variable resistors RL and RR as resistance values. After the programming procedure PP is completed, in step S440, the supply voltage is reduced to the logic low level L (for example, 0V) in the sleep mode STB, so as to stop supplying electricity to the latch unit 110 and reduce power consumption.

Figure 5A:
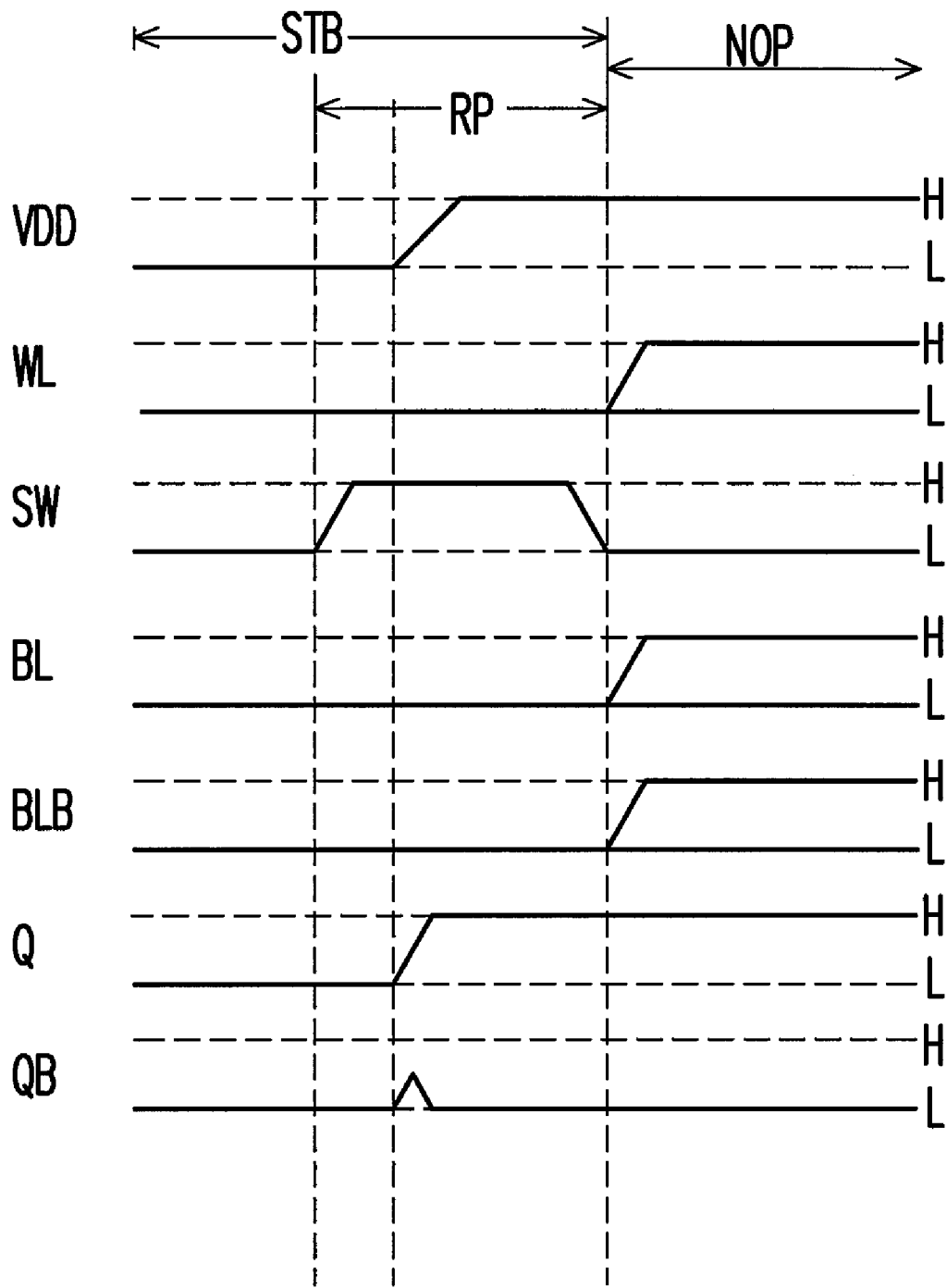
FIG. 5A is a diagram illustrating the signal timing when the NV-SRAM in FIG. 3 performs a recall procedure according to an embodiment of the present disclosure.
Figure 5B:
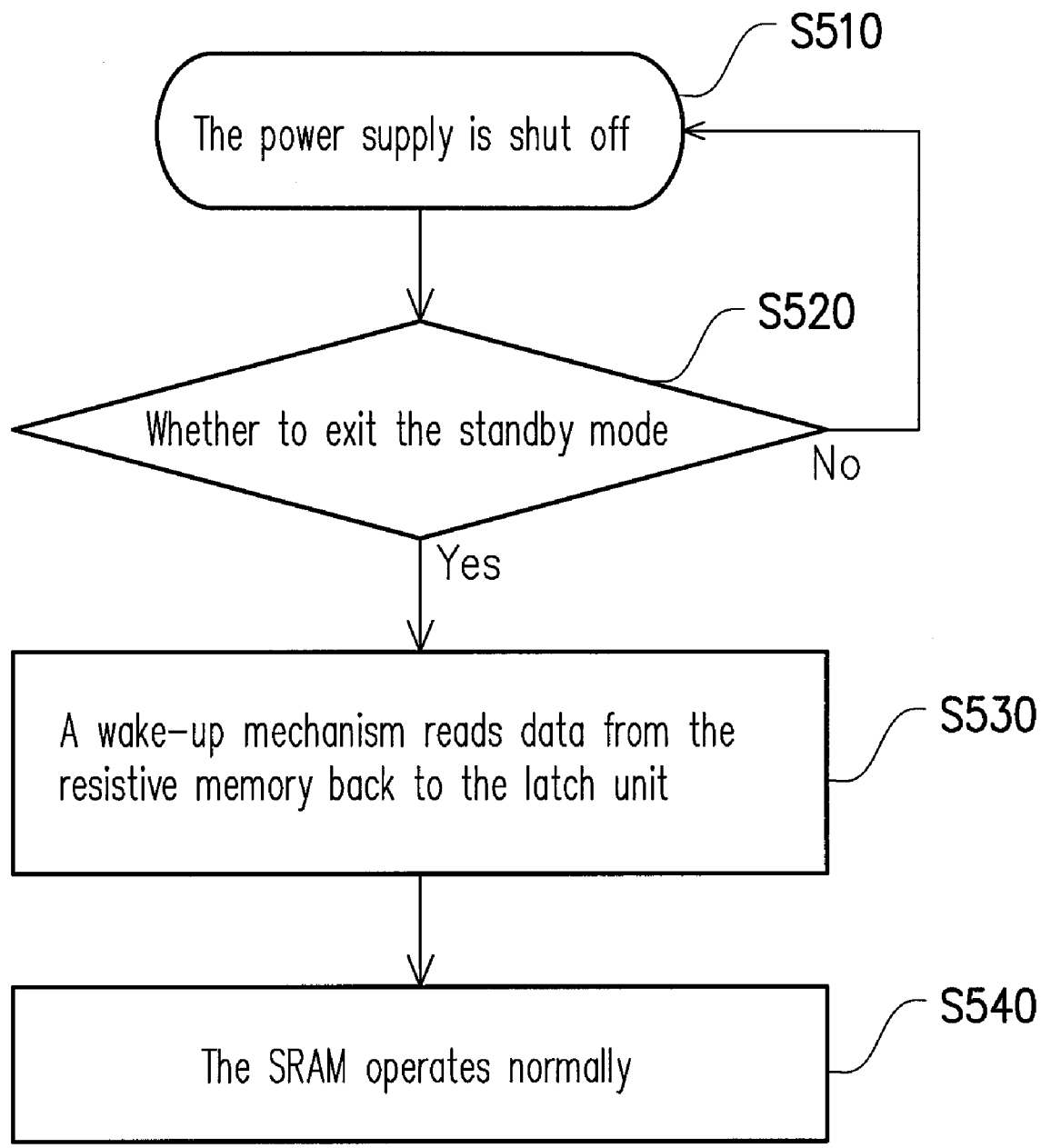
FIG. 5B is a flowchart illustrating how the NV-SRAM in FIG. 3 exits the sleep mode according to an embodiment of the present disclosure.

FIG. 5A is a diagram illustrating the signal timing when the NV-SRAM 100 in FIG. 3 performs a recall procedure RP according to an embodiment of the present disclosure. FIG. 5B is a flowchart illustrating how the NV-SRAM 100 in FIG. 3 performs the recall procedure RP according to an embodiment of the present disclosure. Referring to FIG. 3, FIG. 5A, and FIG. 5B, in the sleep mode STB (i.e., with the power supply being shut off (step S510), the NV-SRAM 100 determines whether to exit the sleep mode STB in step S520. If the NV-SRAM 100 determines to exit the sleep mode STB in step S520, it performs the recall procedure RP first (step S530). Namely, a wake-up mechanism is triggered to read the information from the variable resistors RR and RL back to the latch unit 110. In the sleep mode STB, the supply voltage VDD of the latch unit 110, the voltage on the word line WL, the voltage on the first bit line BL, and the voltage on the second bit line BLB are all set to 0V. In the recall procedure RP, the enable line SW is first pulled up to the logic high level H to turn on the third switch SW3 and the fourth switch SW4. After the third switch SW3 and the fourth switch SW4 are turned on, the supply of the supply voltage VDD is resumed. Herein the voltages on the first terminal Q and the second terminal QB of the latch unit 110 are determined by the resistances of the variable resistors RR and RL. With the supply of the supply voltage VDD being resumed in the recall procedure RP, a charging current runs through the transistors M1 and M3 of the latch unit 110 so that the voltages on the first terminal Q and the second terminal QB are boosted up. Meanwhile, the discharging currents output from the first terminal Q and the second terminal QB respectively run through the variable resistor RL and RR. When the first variable resistor RL is in the high resistance state HRS and the second variable resistor RR is in the low resistance state LRS, the current running through the second variable resistor RR is greater than that running through the first variable resistor RL, and accordingly the first terminal Q and the second terminal QB of the latch unit 110 are charged at different speeds. The voltage difference between the first terminal Q and the second terminal QB is amplified to the logic high level H and the logic low level L by a cross-couple latch of the latch unit 110, so that the recall procedure RP is completed and the data storage before the sleep mode STB is restored. Herein, the NV-SRAM 100 returns to the regular operation mode NOP (i.e., step S540).

Figure 6:
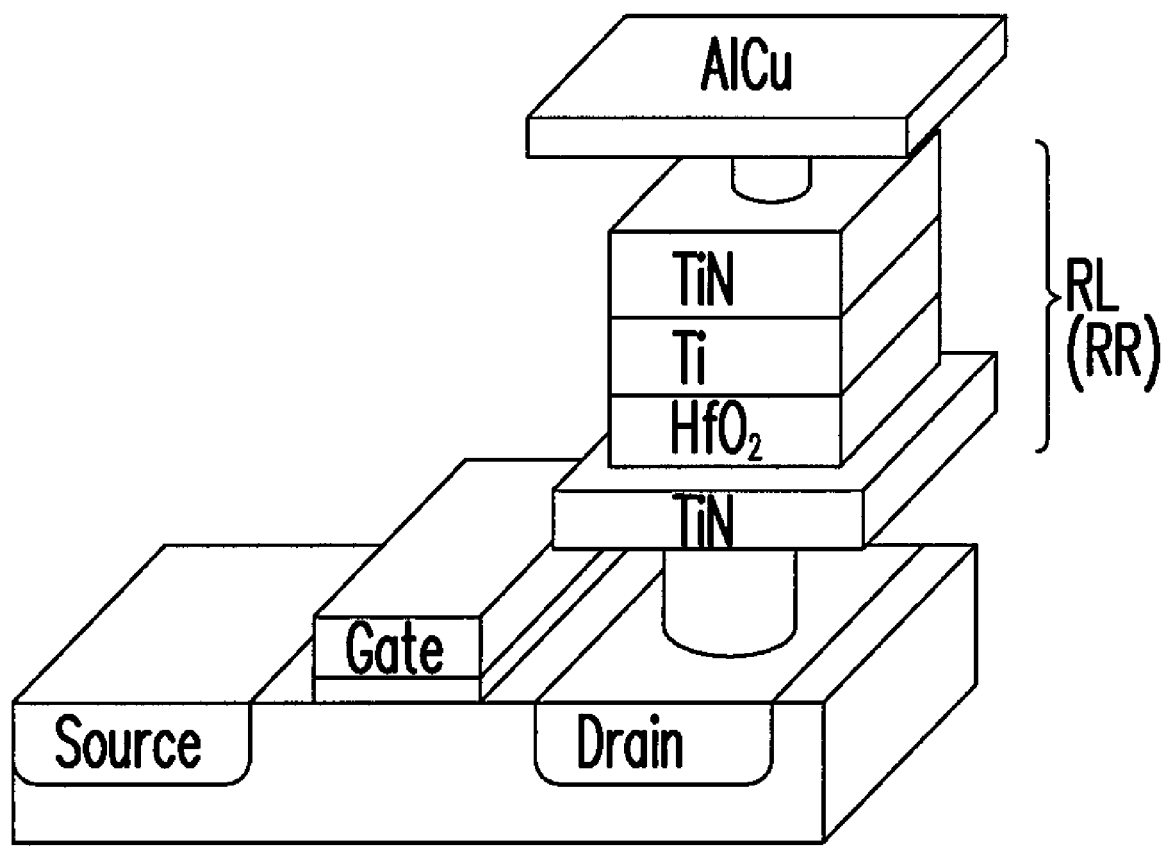
FIG. 6 is a perspective view of a variable resistor according to an embodiment of the present disclosure.

FIG. 6 is a perspective view of the variable resistor RL (or RR) according to an embodiment of the present disclosure. The first variable resistor RL (or the second variable resistor RR) is disposed above a substrate of the IC. The first variable resistor RL (or the second variable resistor RR) is a resistive memory having a metal/insulator/metal (MIM) structure formed by stacking a bottom electrode, a variable resistor, and a top electrode sequentially. The bottom electrode is electrically connected to the drain of the first terminal Q (or the second terminal QB) of the latch unit 110 through a contact plug. In the present embodiment, the bottom electrode is fabricated of TiN. In other embodiments, the bottom electrode may also be an oxide, nitride, or oxynitride of Mn, Fe, Ni, Co, Ti, Cu, V, or Si, such as Ti, $SiO_2$, or Si. In the present embodiment, a $HfO_2$ membrane is plated on the bottom electrode through atomic layer chemical vapor deposition (AL-CVD to form aforementioned variable resistor. After that, Ti and TiN are plated on the variable resistor to form the top electrode. The top electrode is electrically connected to the first terminal of the third switch SW3 (or the fourth switch SW4) through a via plug and a metal interconnection.

Figure 7:
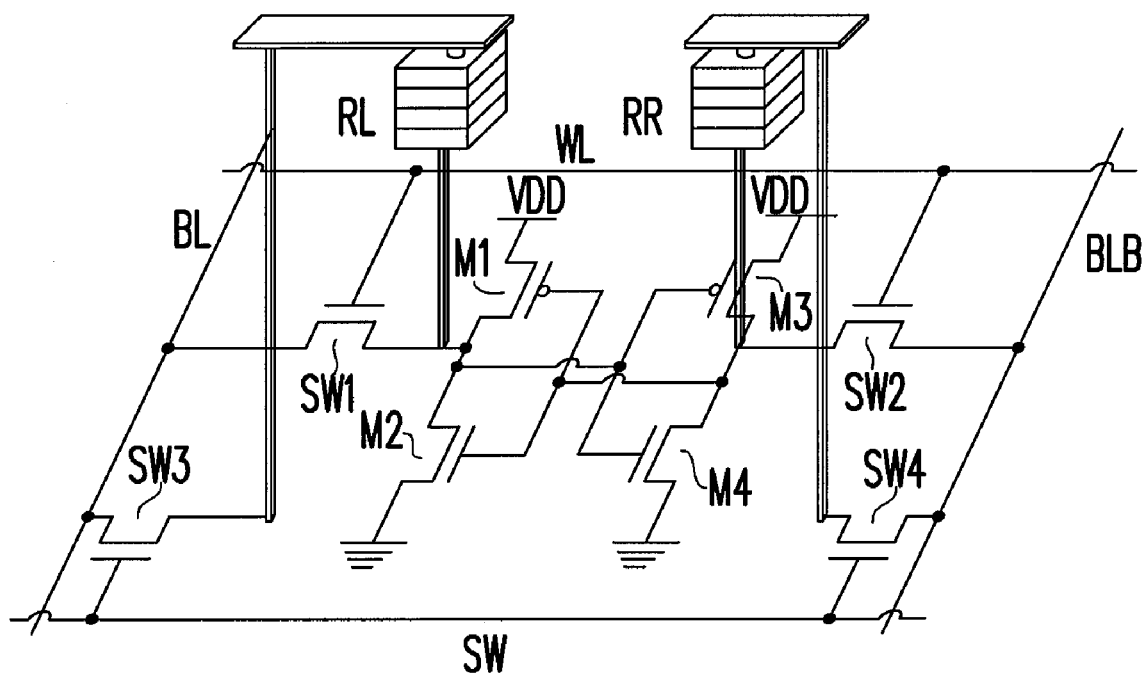
FIG. 7 is a perspective view illustrating how variable resistors in FIG. 3 are disposed above a substrate according to an embodiment of the present disclosure.

FIG. 7 is a perspective view illustrating how the variable resistors RR and RL in FIG. 3 are disposed above the substrate according to an embodiment of the present disclosure. Most components of the NV-SRAM 100 are disposed in the substrate, while the variable resistors RR and RL are disposed above the substrate. Namely, the variable resistors RR and RL are stacked above the latch unit 110, the first switch SW1, the second switch SW2, the third switch SW3, and/or the fourth switch SW4. Thus, the chip area is not increased by the variable resistors RR and RL.

Figure 8:
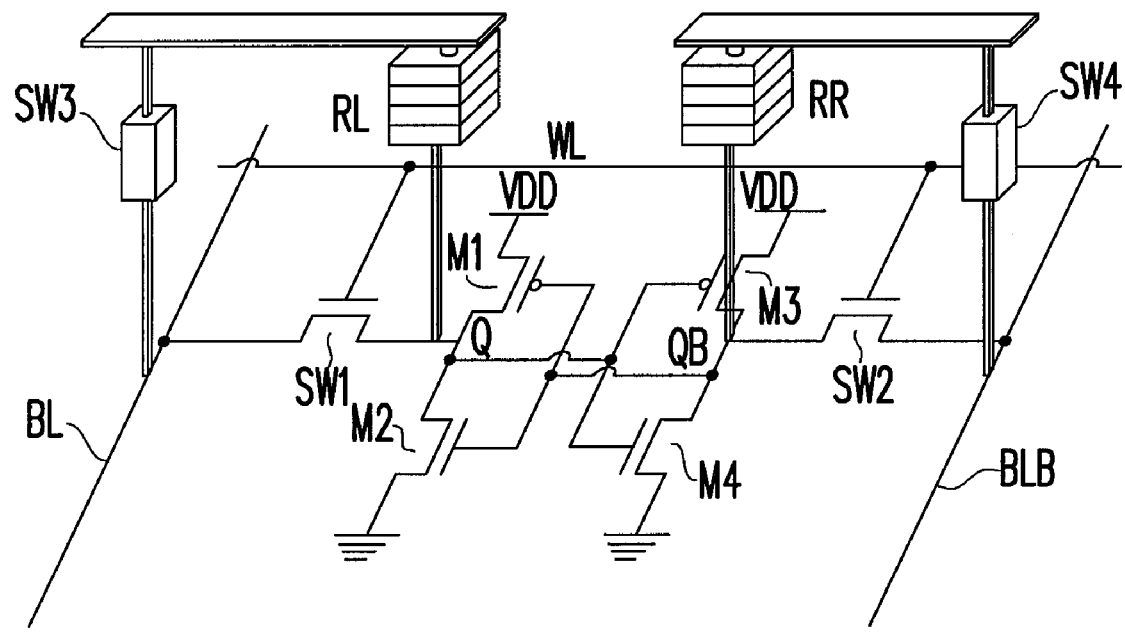
FIG. 8 is a perspective view illustrating how the variable resistors and switches in FIG. 3 are disposed above the substrate according to another embodiment of the present disclosure.

FIG. 8 is a perspective view illustrating how the variable resistors RR and RL and the switches SW3 and SW4 in FIG. 3 are disposed above the substrate according to another embodiment of the present disclosure. Most components of the NV-SRAM 100 are disposed in the substrate, while the first variable resistor RL and the third switch SW3 of the first NVM 120 and the second variable resistor RR and the fourth switch SW4 of the second NVM 130 are disposed above the substrate. Namely, the second variable resistor RR, the first variable resistor RL, the third switch SW3, and the fourth switch SW4 are stacked above the latch unit 110, the first switch SW1, and/or the second switch SW2. Thus, the chip area is not increased by the NVMs 120 and 130

In the embodiment described above, SRAM devices and resistive NVM devices are integrated in a simple and area-efficient structure so that power supply can be cut off in the sleep mode to reduce power consumption. Additionally, the structure described in foregoing embodiment further facilitates write operations and improves the performance of the regular operation. Forgoing embodiment may be applied to an embedded system that requires a low power consumption and a high operation speed. The advantage of reduced power consumption of foregoing embodiment is even more outstanding if the embodiment is applied to an application with a lot of standby time. This structure is in a differential mode therefore can tolerate a great process variation. Particularly, even if the resistive NVMs have great resistance variations, the stored data can be correctly identified in the recall procedure RP (the wake-up mechanism) as long as the high resistance state HRS is greater than the low resistance state LRS, so that the production yield is greatly increased.

The operation method of the NV-SRAM 100 will be described herein. The operation method includes performing the programming procedure PP when the sleep mode STB is entered and performing the recall procedure RP when the sleep mode STB is ended. In the programming procedure PP, the first NVM 120 and the second NVM 130 are enabled through the enable line SW, and the first switch SW1 and the second switch SW2 are turned off through the word line WL. During the first period PP1 of the programming procedure PP, a voltage at the logic high level H is supplied to the first NVM 120 and the second NVM 130 through the first bit line BL and the second bit line BLB. During the second period PP2 of the programming procedure PP, a voltage at the logic low level L is supplied to the first NVM 120 and the second NVM 130 through the first bit line BL and the second bit line BLB. In the recall procedure RP, the first NVM 120 and the second NVM 130 are enabled through the enable line SW, a voltage at the logic low level L is supplied to the first NVM 120 and the second NVM 130 through the first bit line BL and the second bit line BLB, and the first switch SW1 and the second switch SW2 are turned off through the word line WL.

Figure 9A:
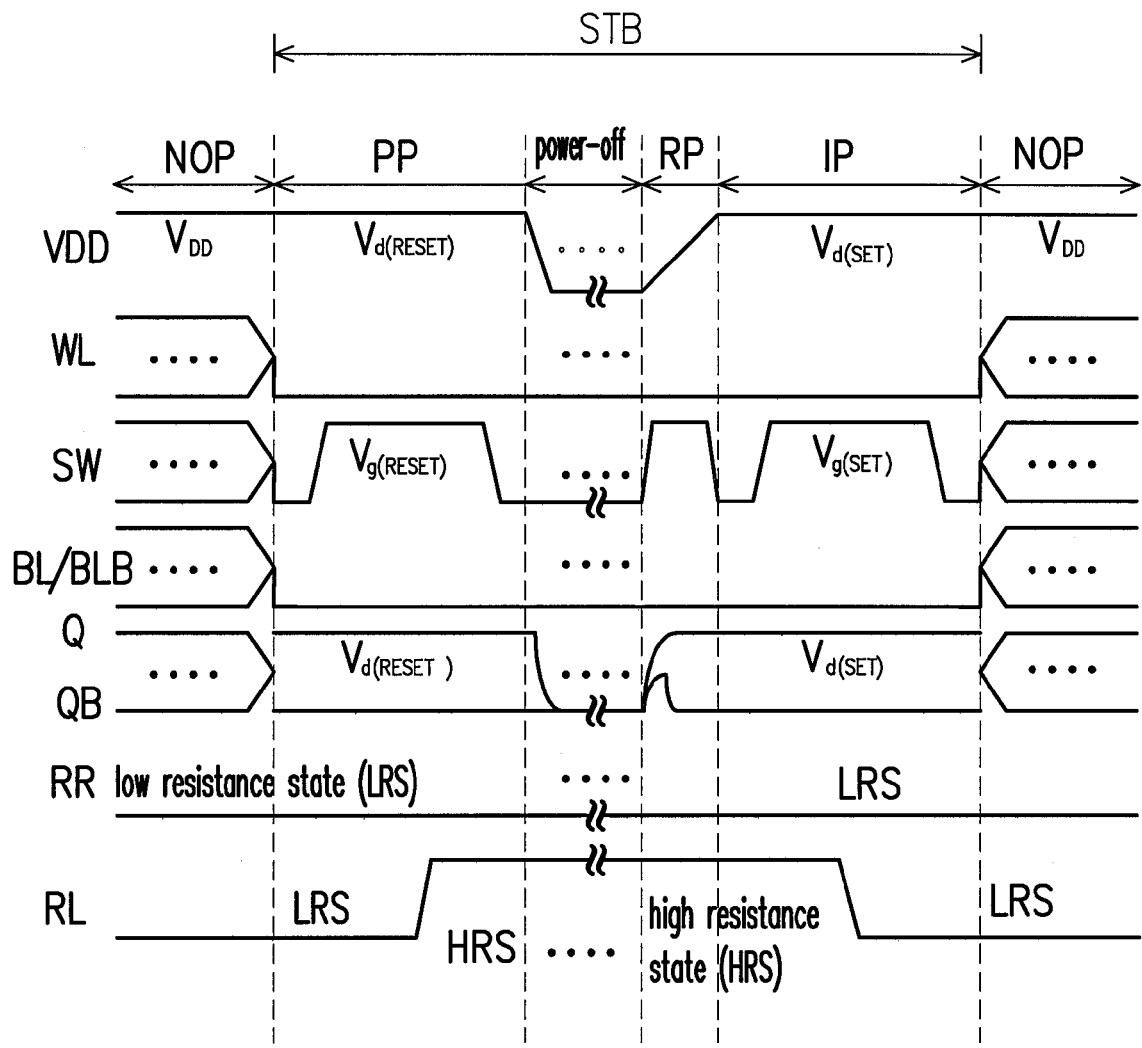
FIG. 9A is a diagram illustrating the signal timing when the NV-SRAM in FIG. 3 performs a programming procedure, a recall procedure, and an initiate procedure according to another embodiment of the present disclosure.
Figure 9B:
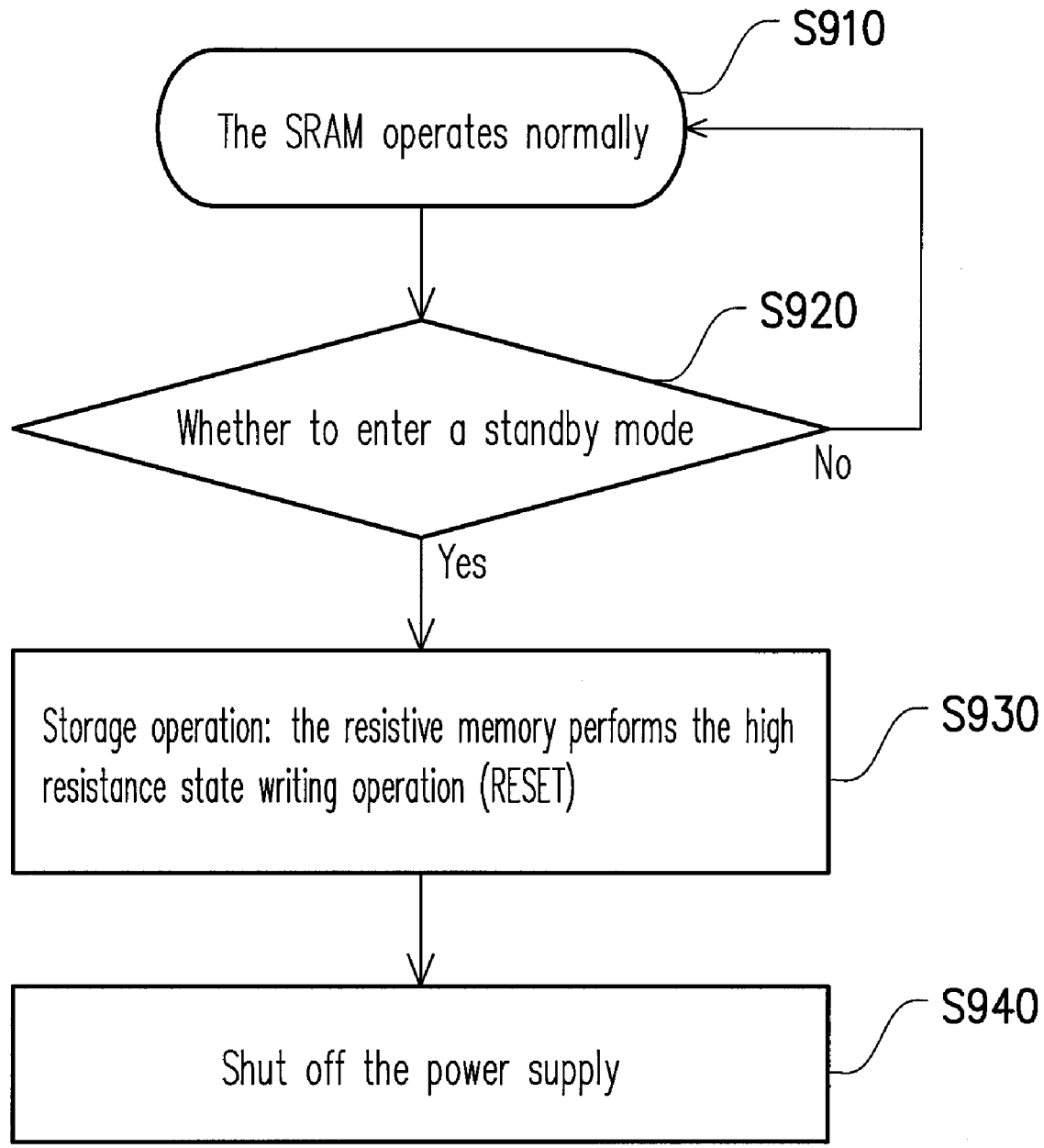
FIG. 9B is a flowchart illustrating how the NV-SRAM in FIG. 3 enters a sleep mode according to another embodiment of the present disclosure.
Figure 9C:
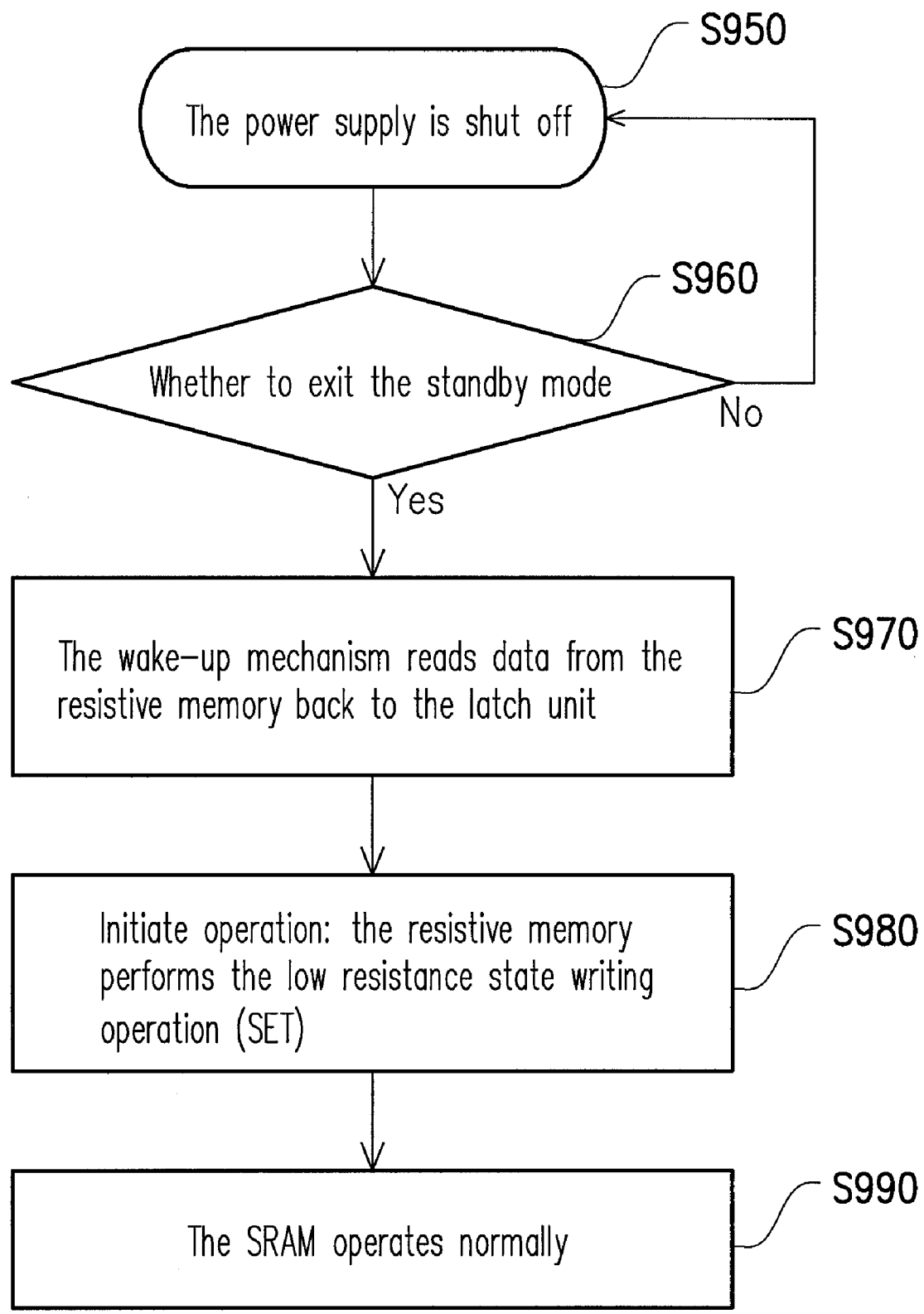
FIG. 9C is a flowchart illustrating how the NV-SRAM in FIG. 3 exits the sleep mode according to another embodiment of the present disclosure.

If the variable resistors RL and RR are unipolar resistive memories, the NV-SRAM 100 can carry out the operation method illustrated in FIGS. 9A-9C. FIG. 9A is a diagram illustrating the signal timing when the NV-SRAM 100 in FIG. 3 performs the programming procedure PP, the recall procedure RP, and an initiate procedure IP according to another embodiment of the present disclosure. FIG. 9B is a flowchart illustrating how the NV-SRAM 100 in FIG. 3 enters the sleep mode STB according to another embodiment of the present disclosure. Referring to FIG. 3, FIG. 9A, and FIG. 9B, in the regular operation mode NOP (i.e., step S910), the NV-SRAM 100 is addressed through the word line WL, and the information recorded by the latch unit 110 is accessed through the first bit line BL and/or the second bit line BLB. In a regular read operation, the third switch SW3 and the fourth switch SW4 are turned off through the enable line SW, so that the resistive memories (i.e., the variable resistors RR and RL) do not affect the operation speed of the NV-SRAM 100 in the regular read operation. In a regular write operation, the third switch SW3 and the fourth switch SW4 are turned on through the enable line SW. Thus, in the regular write operation, an additional current path is formed by the variable resistors RR and RL such that the write operation can be sped up and carried out with a low voltage level. Thus, in the regular operation mode NOP, the NV-SRAM 100 offers a more stable and faster performance than a SRAM and can operate with a low voltage level to reduce the power consumption.

In the regular operation mode, whether the sleep mode STB should be entered is determined in step S920. If it is determined in step S920 that the sleep mode STB is to be entered, the programming procedure PP is performed (i.e., S930). In the programming procedure PP, the word line WL is at the logic low level L so that the first switch SW1 and the second switch SW2 are turned off, and the resistance state of the first NVM 120 or the second NVM 130 is changed by modulating the supply voltage VDD of the latch unit 110 and/or the voltages on the first bit line BL and the second bit line BLB. Herein it is assumed that before the sleep mode STB is entered, the voltages on the first terminal Q and the second terminal QB of the latch unit 110 are respectively at the logic high level H and the logic low level L. In the programming procedure PP, the supply voltage VDD of the latch unit 110 is adjusted from a normal level $V_{DD}$ to a voltage level $V_{d(RESET)}$. Thus, the voltage on the first terminal Q of the latch unit 110 is also adjusted to the voltage level $V_{d(RESET)}$. In the present embodiment, the voltage level $V_{d(RESET)}$ may be 1.8V or have other values.

In the programming procedure PP, the first NVM 120 and the second NVM 130 are enabled through the enable line SW. In the present embodiment, the voltage on the enable line SW is pulled up to a voltage level $V_{g(RESET)}$ such that the third switch SW3 and the fourth switch SW4 are turned on. In the present embodiment, the voltage level $V_{g(RESET)}$ may be 1.8V or have other values. Additionally, in the programming procedure PP, a logic low voltage (for example, 0V) is supplied to the variable resistors (or resistive memories) RR and RL through the first bit line BL and the second bit line BLB. Because the voltage difference between the two terminals of the first variable resistor RL reaches a voltage state for performing a high resistance state writing operation (RESET), the first variable resistor RL is set to the logic high resistance state HRS. Because the voltages on the two terminals of the second variable resistor RR are both at a logic low level, the logic resistance state of the second variable resistor RR is not changed but maintained at the low resistance state LRS.

Thus, when the sleep mode STB is entered, each NV-SRAM 100 stores the data stored by the latch unit 110 into the variable resistors RL and RR as resistance values. After the programming procedure PP is completed, step S940 is executed to reduce the supply voltage VDD to a logic low level (for example, 0V) in the sleep mode STB, so as to stop supplying electricity to the latch unit 110 and reduce power consumption.

FIG. 9C is a flowchart illustrating how the NV-SRAM 100 in FIG. 3 exits the sleep mode STB according to another embodiment of the present disclosure. Referring to FIG. 3, FIG. 9A, and FIG. 9C, in the sleep mode STB (i.e., with the power supply being shut off (step S950)), the NV-SRAM 100 determines whether to exit the sleep mode STB in step S960. If the NV-SRAM 100 determines to exit the sleep mode STB in step S960, the recall procedure RP (step S970) and an initiate procedure IP (step S980) are performed. Namely, a wake-up mechanism is triggered to read the information from the variable resistors RR and RL back into the latch unit 110. In the recall procedure RP, the NVMs 120 and 130 are enabled through the enable line SW, the first switch SW1 and the second switch SW2 are turned off through the word line WL, and a logic low voltage is supplied to the NVMs 120 and 130 through the bit lines BL and BLB.

In the sleep mode STB, the supply voltage VDD of the latch unit 110, the voltage on the word line WL, the voltage on the first bit line BL, and the voltage on the second bit line BLB are all set to 0V. To perform the recall procedure RP (step S970), the voltage on the enable line SW is pulled up to a logic high level to turn on the third switch SW3 and the fourth switch SW4. After the third switch SW3 and the fourth switch SW4 are turned on, the supply of the supply voltage VDD is resumed. Herein the voltages on the first terminal Q and the second terminal QB of the latch unit 110 are determined by the resistance values of the variable resistors RR and RL. With the supply of the supply voltage VDD being resumed in the recall procedure RP, a charging current runs through the transistors M1 and M3 of the latch unit 110 so that the voltages on the first terminal Q and the second terminal QB are boosted up. Meanwhile, the discharging currents output from the first terminal Q and the second terminal QB respectively run through the first variable resistor RL and the second variable resistor RR. When the first variable resistor RL is in the high resistance state HRS and the second variable resistor RR is in the low resistance state LRS, the current running through the second variable resistor RR is greater than that running through the first variable resistor RL. As a result, the first terminal Q and the second terminal QB of the latch unit 110 are charged at different speeds. The voltage difference between the first terminal Q and the second terminal QB is amplified by a cross-couple latch of the latch unit 110 into a high voltage level and a low voltage level, so that the recall procedure RP is completed and the data storage before the sleep mode STB is restored.

After the recall procedure RP is completed, the initiate procedure IP is then performed (step S980). Namely, the resistance states of the variable resistors RR and RL are initialized to the low resistance state LRS. In the initiate procedure IP, the first NVM 120 and the second NVM 130 are enabled through the enable line SW, the first switch SW1 and the second switch SW2 are turned off through the word line WL, and the resistance states of the first NVM 120 and the second NVM 130 are initialized by modulating the supply voltage VDD of the latch unit 110 and/or the voltages on the first bit line BL and the second bit line BLB.

For example, in the initiate procedure IP, the supply voltage VDD on the latch unit 110 is adjusted to a voltage level $V_{d(SET)}$. Thus, the voltage on the first terminal Q of the latch unit 110 is also adjusted to the voltage level $V_{d(SET)}$. Herein the voltage level $V_{d(RESET)}$ may be 2.2 V or have other values. In the regular operation mode NOP, the supply voltage VDD on the latch unit 110 is adjusted back to the normal voltage level $V_{DD}$. In addition, in the initiate procedure IP, the voltage on the enable line SW is pulled up to a voltage level $V_{g(SET)}$ such that the third switch SW3 and the fourth switch SW4 are turned on. In the present embodiment, the voltage level $V_{g(SET)}$ may be 0.8 V or have other values. Moreover, in the initiate procedure IP, a logic low voltage (for example, 0V) is supplied to the variable resistors RR and RL through the first bit line BL and the second bit line BLB. Because the voltage difference between the two terminals of the first variable resistor RL reaches a voltage state for performing a low resistance state writing operation (SET), the first variable resistor RL is initialized to the logic low resistance state LRS.

Because the voltages on the two terminals of the second variable resistor RR are both at a logic low level, the logic resistance state of the second variable resistor RR is not changed but maintained at the logic low resistance state LRS. By now, the initiate procedure IP is completed. After that, the NV-SRAM 100 returns to the regular operation mode NOP (i.e., step S990).

In summary, the NV-SRAM 100 disclosed in one of foregoing embodiments offers the advantages of both a SRAM and a NVM. In a random access operation mode (i.e., the regular operation mode NOP), the NV-SRAM 100 offers the high access speed of a SRAM. Moreover, the structure of the NV-SRAM 100 further facilitates write operations so that the NV-SRAM 100 can operate with a low voltage level. Thus, the power consumed while performing a write operation is greatly reduced. When the NV-SRAM 100 enters the sleep mode STB, the NV-SRAM 100 stores data into the variable resistors RR and RL as different resistance values. After that, the supply voltage VDD can be cut off without losing the stored data. Thus, the power consumption is reduced to zero in the sleep mode STB. In the recall procedure RP, the voltages on the first terminal Q and the second terminal QB of the latch unit 110 are restored to the states before the supply voltage VDD is cut off according to the different resistances of the variable resistors RR and RL.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A non-volatile static random access memory (NV-SRAM), comprising:
   a latch unit, having a first terminal and a second terminal;
   a first switch, having a first terminal connected to the first terminal of the latch unit, a second terminal connected to a first bit line, and a control terminal connected to a word line;
   a second switch, having a first terminal connected to the second terminal of the latch unit, a second terminal connected to a second bit line, and a control terminal connected to the word line;
   a first non-volatile memory (NVM), having a first terminal connected to the first terminal of the latch unit, a second terminal connected to the first bit line, and an enable terminal connected to an enable line; and
   a second NVM, having a first terminal connected to the second terminal of the latch unit, a second terminal connected to the second bit line, and an enable terminal connected to the enable line.

2. The NV-SRAM according to claim 1, wherein the latch unit comprises:
   a first NOT gate, having an input terminal served as the first terminal of the latch unit, and an output terminal served as the second terminal of the latch unit; and
   a second NOT gate, having an input terminal connected to the output terminal of the first NOT gate, and an output terminal connected to the input terminal of the first NOT gate.

3. The NV-SRAM according to claim 1, wherein the latch unit comprises:
   a first transistor, having a first terminal connected to a first voltage, a second terminal connected to the first terminal of the latch unit, and a control terminal connected to the second terminal of the latch unit;
   a second transistor, having a first terminal connected to a second voltage, a second terminal connected to the second terminal of the first transistor, and a control terminal connected to the control terminal of the first transistor;
   a third transistor, having a first terminal connected to the first voltage, a second terminal connected to the second terminal of the latch unit, and a control terminal connected to the first terminal of the latch unit; and
   a fourth transistor, having a first terminal connected to the second voltage, a second terminal connected to the second terminal of the third transistor, and a control terminal connected to the control terminal of the third transistor.

4. The NV-SRAM according to claim 1, wherein the first switch comprises:
   a fifth transistor, having a first terminal connected to the first terminal of the latch unit, a second terminal connected to the first bit line, and a control terminal connected to the word line.

5. The NV-SRAM according to claim 1, wherein the second switch comprises:
   a sixth transistor, having a first terminal connected to the second terminal of the latch unit, a second terminal connected to the second bit line, and a control terminal connected to the word line.

6. The NV-SRAM according to claim 1, wherein the first NVM comprises:
   a third switch, having a control terminal connected to the enable line; and
   a first variable resistor, wherein the third switch and the first variable resistor are connected between the first terminal of the latch unit and the first bit line in series.

7. The NV-SRAM according to claim 6, wherein the third switch is turned on in a regular write operation.

8. The NV-SRAM according to claim 6, wherein the third switch is a metal oxide semiconductor (MOS) transistor, a bipolar junction transistor (BJT), or a diode.

9. The NV-SRAM according to claim 1, wherein the second NVM comprises:
   a fourth switch, having a control terminal connected to the enable line; and
   a second variable resistor, wherein the fourth switch and the second variable resistor are connected between the second terminal of the latch unit and the second bit line in series.

10. The NV-SRAM according to claim 9, wherein the fourth switch is turned on in a regular write operation.

11. The NV-SRAM according to claim 9, wherein the fourth switch is a MOS transistor, a BJT, or a diode.

12. The NV-SRAM according to claim 1, wherein the NV-SRAM performs a programming procedure when a sleep mode is entered, and the NV-SRAM performs a recall procedure when the sleep mode is ended; in the programming procedure, the first NVM and the second NVM are enabled, and the first switch and the second switch are turned off; during a first period of the programming procedure, a logic high voltage is supplied to the first NVM and the second NVM through the first bit line and the second bit line; and during a second period of the programming procedure, a logic low voltage is supplied to the first NVM and the second NVM through the first bit line and the second bit line; in the recall procedure, the first NVM and the second NVM are enabled, the first switch and the second switch are turned off, and a logic low voltage is supplied to the first NVM and the second NVM through the first bit line and the second bit line.

13. The NV-SRAM according to claim 12, wherein no electricity is supplied to the latch unit after the programming procedure is completed.

14. The NV-SRAM according to claim 12, wherein the first NVM and the second NVM are disabled in a regular read operation.

15. The NV-SRAM according to claim 12, wherein the first NVM and the second NVM are enabled in a regular write operation.

16. An operation method of a non-volatile static random access memory (NV-SRAM), wherein the NV-SRAM comprises:
   a latch unit, having a first terminal and a second terminal;
   a first switch, having a first terminal connected to the first terminal of the latch unit, a second terminal connected to a first bit line, and a control terminal connected to a word line;
   a second switch, having a first terminal connected to the second terminal of the latch unit, a second terminal connected to a second bit line, and a control terminal connected to the word line;
   a first non-volatile memory (NVM), having a first terminal connected to the first terminal of the latch unit, a second terminal connected to the first bit line, and an enable terminal connected to an enable line; and
   a second NVM, having a first terminal connected to the second terminal of the latch unit, a second terminal connected to the second bit line, and an enable terminal connected to the enable line, the operation method comprising:
   performing a programming procedure when a sleep mode is entered;
   performing a recall procedure when the sleep mode is ended;
   in the programming procedure, enabling the first NVM and the second NVM through the enable line, and turning off the first switch and the second switch through the word line;
   during a first period of the programming procedure, supplying a logic high voltage to the first NVM and the second NVM through the first bit line and the second bit line;
   during a second period of the programming procedure, supplying a logic low voltage to the first NVM and the second NVM through the first bit line and the second bit line; and
   in the recall procedure, enabling the first NVM and the second NVM through the enable line, supplying a logic low voltage to the first NVM and the second NVM through the first bit line and the second bit line, and turning off the first switch and the second switch through the word line.

17. The operation method according to claim 16 further comprising:
   stopping supplying electricity to the latch unit after the programming procedure is completed.

18. The operation method according to claim 16 further comprising:
   in a regular read operation, disabling the first NVM and the second NVM through the enable line.

19. The operation method according to claim 16 further comprising:
   in a regular write operation, enabling the first NVM and the second NVM.

20. An operation method of a non-volatile static random access memory (NV-SRAM), wherein the NV-SRAM comprises:
   a latch unit, having a first terminal and a second terminal;
   a first switch, having a first terminal connected to the first terminal of the latch unit, a second terminal connected to a first bit line, and a control terminal connected to a word line;
   a second switch, having a first terminal connected to the second terminal of the latch unit, a second terminal connected to a second bit line, and a control terminal connected to the word line;
   a first non-volatile memory (NVM), having a first terminal connected to the first terminal of the latch unit, a second terminal connected to the first bit line, and an enable terminal connected to an enable line; and
   a second NVM, having a first terminal connected to the second terminal of the latch unit, a second terminal connected to the second bit line, and an enable terminal connected to the enable line,
   the operation method comprising:
   performing a programming procedure when a sleep mode is entered;
   performing a recall procedure and an initiate procedure when the sleep mode is ended;
   in the programming procedure, enabling the first NVM and the second NVM through the enable line, turning off the first switch and the second switch through the word line, and changing a resistance state of the first NVM or the second NVM by modulating a supply voltage of the latch unit and/or voltages on the first bit line and the second bit line;
   in the recall procedure, enabling the first NVM and the second NVM through the enable line, turning off the first switch and the second switch through the word line, and supplying a logic low voltage to the first NVM and the second NVM through the first bit line and the second bit line; and
   in the initiate procedure, enabling the first NVM and the second NVM through the enable line, turning off the first switch and the second switch through the word line, and initializing resistance states of the first NVM and the second NVM by modulating the supply voltage of the latch unit and/or voltages on the first bit line and the second bit line.

21. The operation method according to claim 20 further comprising:
   stopping supplying electricity to the latch unit after the programming procedure is completed.

22. The operation method according to claim 20 further comprising:
   in a regular read operation, disabling the first NVM and the second NVM through the enable line.

23. The operation method according to claim 20 further comprising:
   in a regular write operation, enabling the first NVM and the second NVM.

* * * * *